(12) United States Patent
Zeine et al.

(10) Patent No.: US 10,673,284 B2
(45) Date of Patent: Jun. 2, 2020

(54) FAIL SAFE BLOCKS

(71) Applicant: Ossia Inc., Bellevue, WA (US)

(72) Inventors: Hatem Ibrahim Zeine, Bellevue, WA (US); Ahmad Moghaddam, Kirkland, WA (US)

(73) Assignee: Ossia Inc., Bellevue, WA (US)

( * ) Notice: Subject to any disclaimer, the term of this patent is extended or adjusted under 35 U.S.C. 154(b) by 309 days.

(21) Appl. No.: 15/712,462

(22) Filed: Sep. 22, 2017

(65) Prior Publication Data

US 2019/0097464 A1 Mar. 28, 2019

(51) Int. Cl.
| | |
|---|---|
| *H02J 50/40* | (2016.01) |
| *G01R 29/10* | (2006.01) |
| *H02J 50/20* | (2016.01) |
| *H02J 7/02* | (2016.01) |

(52) U.S. Cl.
CPC ............. *H02J 50/40* (2016.02); *G01R 29/10* (2013.01); *H02J 50/20* (2016.02); *H02J 7/025* (2013.01)

(58) Field of Classification Search
CPC .. H02J 50/40; H02J 50/20; H02J 50/15; H02J 50/80; H02J 7/025; H02J 17/00; H02H 50/00; G01R 29/10
See application file for complete search history.

(56) References Cited

U.S. PATENT DOCUMENTS

2016/0197412 A1\* 7/2016 Fukuda ................. H01Q 23/00
343/861

\* cited by examiner

*Primary Examiner* — Carlos Amaya

(57) ABSTRACT

Various embodiments of the present technology relate generally to wireless power systems. More specifically, some embodiments relate to identifying and correcting failures within wireless power systems (or any other system that is subject to design/device fault). Some embodiments monitor multiple states/control signals in a wireless power transmission system having an array of antenna. A determination can be made as to whether each of the multiple states are in an expected configuration (or make the expected transitions implying different states during normal operations). For examples, this can include identifying whether each antenna in the array of antennas is in a transmitting or receiving state. Any problems (e.g., timing problems, antennas stuck in a Tx or Rx state, controller malfunction, etc.) within the system can be detected by analyzing the multiple states/control signals and compare them against expected behavior/configuration. Some embodiments can activate a mitigation protocol and/or recovery through re-try/re-initialization/reboot processes.

20 Claims, 8 Drawing Sheets

FAIL SAFE BLOCKS

BACKGROUND

Many electronic devices are powered by batteries. Rechargeable batteries are often used to avoid the cost of replacing conventional dry-cell batteries and to conserve precious resources. The requirements of compact and faster devices that are enabled with standard wireless communication modules such as LTE, Wi-Fi, and Bluetooth transceivers have become a basic standard of modern mobile devices. Today's information-oriented users demand more sophisticated applications, and are in need to be connected constantly. These rising demands require more computational and transmission power which leave batteries thirsty for charge.

Rechargeable batteries are one option. However, conventional rechargeable battery chargers often require access to a power source such as an alternating current (AC) power outlet, which may not always be available or convenient. Current techniques for wireless charging have been limited to magnetic or inductive charging based solutions. Unfortunately, these solutions require a wireless power transmission system and a receiver to be in relatively close proximity to one another. Wireless power transmission at larger distances requires more advanced mechanisms such as, for example, transmission via radio frequency (RF) signals, ultrasonic transmissions, laser powering, to name a few, each of which present a number of unique hurdles to commercial success.

Systems that support wireless power transmission at larger distances may use sophisticated signal transmitting (Tx) and receiving (Rx) components. Precisely locating components in the environment and determining signal transmission paths therein is a prerequisite to providing Tx radiation patterns and targeting client Rx devices for efficient data communication and/or wireless power delivery. Further, in such systems, accurate location determinations of Tx and/or Rx devices in a dynamic environment including readily movable line-of-sight (LOS) obstructions is necessary to ensure effective and uninterrupted service. However, as with any electronic device, the Tx and Rx components may fail over time. If a Tx or Rx device is failing, this can create issues for the wireless power transmission system being able to accurately transmit power and communicate between components.

Accordingly, a need exists for technology that overcomes the problem demonstrated above, as well as one that provides additional benefits. The examples provided herein of some prior or related systems and their associated limitations are intended to be illustrative and not exclusive. Other limitations of existing or prior systems will become apparent to those of skill in the art upon reading the following Detailed Description.

SUMMARY

Various embodiments of the present technology relate generally to wireless power systems. More specifically, some embodiments relate to identifying and correcting failures within wireless power systems. Some embodiments provide for a method that includes monitoring multiple states and/or control signals in a wireless power transmission system having an array of antenna(s). A determination can also be made as to whether each of the multiple states/control signals are in an expected configuration. For example, this can include identifying whether each antenna in the array of antennas is in a transmitting or receiving state. Any problems (e.g., timing problems, antennas stuck in a Tx or Rx state, etc.) within the wireless power transmission system can be determined by analyzing the multiple states and expected configuration. As another example, the system can check for a phase that should vary in a dynamic environment, remain contestant in static environment, phase change that is gradual given slow speed of a moving client, etc. Some embodiments can activate a mitigation protocol (e.g., deactivate the one or more antennas within the array of antennas that are stuck in the transmission or receiving, reset, violating signal timing behavior, etc.). In addition, one or more notifications may be sent (e.g., to a control system and/or system administrator) for corrective action by the system operator or system processor.

Some embodiments may monitor and/or track the multiple states and/or control signals in the wireless power transmission system over a period of time. Using this information, the multiple states and expected behavior/configuration can be analyzed (e.g., using a pattern matching/sequence analysis) to identify the problems.

Embodiments of the present invention also include computer-readable storage media containing sets of instructions to cause one or more processors to perform the methods, variations of the methods, and other operations described herein.

Some embodiments provide for a wireless power transmission system that includes a memory, one or more processors, an adaptively-phased antenna array, control circuitry, a pattern matching engine, and/or a fail-safe protection module. The adaptively-phased antenna array can include multiple radio frequency (RF) antennas that can be controlled by the control circuitry. For example, the control circuitry can generate a set of control signals to place the multiple RF antennas in a desired set of states. The control circuitry can also monitor an actual set of states of the multiple RF antennas and identify any potential problems with one or more of the multiple RF antennas based on the actual set of states and the desired set of states. In some embodiments, the control circuitry can record the actual set of states, the set of control signals, and the desired set of states over multiple cycles or a period of time. Using the pattern matching engine, a pattern matching analysis can be used to identify the potential problems given an expected behavior on control signal activities.

The fail-safe protection module (FSPM) can be configured to deactivate one or more antennas of the multiple RF antennas that are stuck in a transmission or receiving state. In some embodiments, the fail-safe protection module may initiate one or more recovery or mitigation workflows. The control circuitry may be further configured to update subsequent control signals by taking into account the one or more antennas that have been deactivated.

While multiple embodiments are disclosed, still other embodiments of the present invention will become apparent to those skilled in the art from the following detailed description, which shows and describes illustrative embodiments of the invention. As will be realized, the invention is capable of modifications in various aspects, all without departing from the scope of the present invention. Accordingly, the drawings and detailed description are to be regarded as illustrative in nature and not restrictive.

BRIEF DESCRIPTION OF THE DRAWINGS

Embodiments of the present technology will be described and explained through the use of the accompanying drawings in which.

Figure 1:
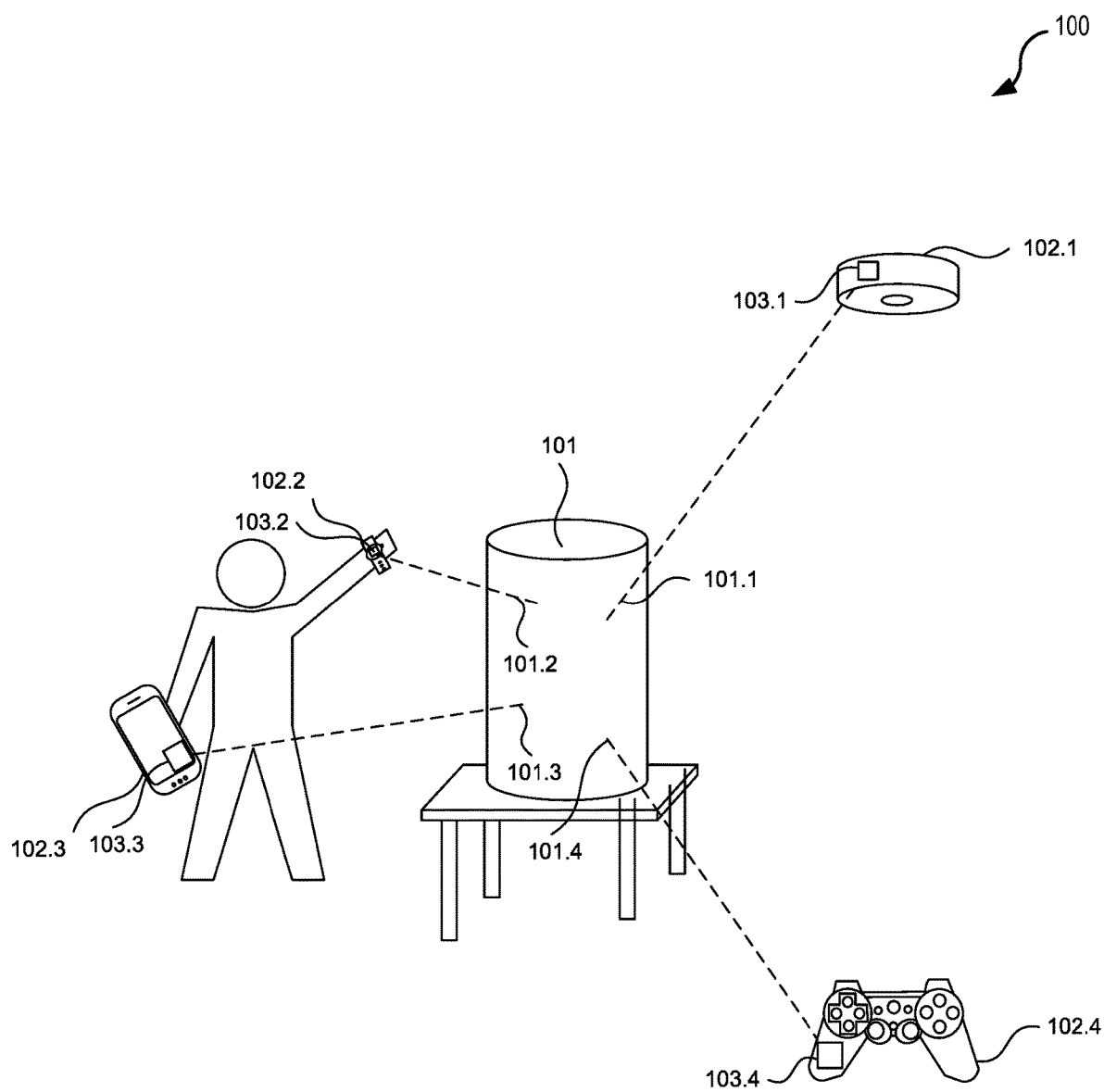
FIG. 1 is a diagram illustrating an example wireless communication/power delivery environment that may be utilized in one or more embodiments of the present technology.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present technology relate generally to wireless power systems. More specifically, some embodiments relate to identifying, mitigating, and correcting failures within wireless power systems. For example, transceivers can get stuck in a transmit or receive mode as a result of a defect, bug, external attack, or other failure symptoms. Various embodiments of the present technology, monitor control signals to make sure transceivers or other components do not end up and stay in undesired or invalid states. As a result, some embodiments, monitor activities on the Tx/Rx control line, analyze patterns, and identify potential problems.

For example, in an antenna array of a transmission system engaging with multiple clients, the system can know the phase pattern should be changing when the system is switching between clients or when one or more of the clients is moving. If the expected phase pattern is not changing as expected, a stuck in phase error can be generated and, in response, the system may try to identify a work around solution to let the transmission system know what course of remedy action needs to be taken to insure client to transmission system communication integrity. Similarly, for a static configuration the system can expect to see a static (or generally static) phase configuration. As such, one or more antennas cycling undesirably during a static phase would indicate a potential problem within the wireless power system. In accordance with some embodiments, the fail-safe protection can recognize the problem, generate an error flag, provide the transmission system a corrective action remedy for the problem which insures client to transmission system communication integrity.

Some embodiments may use a state machine analyzer, pattern matching engine, or digital controller to identify invalid states/invalid state transitions within the system (e.g., client, transmitter, etc.). Once an invalid state has been identified, an analysis can be performed to identify the potential cause of the problem and/or one or more potential fixes (e.g., deactivating one or more antennas, cycling power, specific fail-safe workflow, etc.). Such features present in various embodiments help ensure the safety of the end-users in a wireless-power transmission system. Some embodiments may monitor components that control the configurations, power level, timings and circuitry resulting in a "safety-aware" system that provides "failure-safe" configurations. Moreover, some embodiments use safety-aware protocols that implement regular checks and actions in case the state of the system is determined to be a safety hazard.

In the following description, for the purposes of explanation, numerous specific details are set forth in order to provide a thorough understanding of embodiments of the present technology. It will be apparent, however, to one skilled in the art that embodiments of the present technology may be practiced without some of these specific details. While, for convenience, embodiments of the present technology are described with reference to wireless power transmission systems and client receivers, embodiments of the present technology are equally applicable to various computing technologies using antenna arrays.

The techniques introduced here can be embodied as special-purpose hardware (e.g., circuitry), as programmable circuitry appropriately programmed with software and/or firmware, or as a combination of special-purpose and programmable circuitry. Hence, embodiments may include a machine-readable medium having stored thereon instructions which may be used to program a computer (or other electronic devices) to perform a process. The machine-readable medium may include, but is not limited to, floppy diskettes, optical disks, compact disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

FIG. 1 is a diagram illustrating an example wireless communication and power delivery environment 100 depicting wireless power delivery and data communication from one or more wireless transceiver systems 101 to various wireless client devices 102.1 to 102.4 within environment 100. Client power receivers 103.1 to 103.4 can be integrated into respective client devices 102.1 to 102.4 and configured to receive wireless power from the one or more transceiver systems 101. Within environment 100, the wireless delivery of power from transceiver system 101 to client power receivers 103.1 to 103.4 embedded in client devices 102.1 to 102.4 is also referred to herein as a wireless power transfer system (WPTS).

As shown in the embodiments illustrated in FIG. 1, wireless client devices 102.1 to 102.4 can include mobile phone devices (e.g., client device 102.3 having a respective client power receiver 103.3) and wearable electronics (e.g., client device 102.2 having a respective client power receiver 103.2). Client devices 102 can be any wireless device that needs power and is capable of receiving wireless power via one or more integrated client power receivers 103.1 to 103.4.

Client devices 102.1 to 102.4 can be enabled to communicate with transceiver systems 101 and other communication devices (e.g., Wi-Fi and cellular networks). Client devices 102.1 to 102.4 can be further enabled to transmit beacon signals. Other client devices, not shown in FIG. 1, may not be configured and enabled to communicate (e.g., no Bluetooth or Wi-Fi capability) and thus do not transmit beacon signals. As discussed herein, the one or more integrated power receiver clients, or "wireless power receivers," receive and process power from the one or more transceiver systems 101 and provide the power to the client devices 102.1 to 102.4 for operation thereof.

Each transceiver system 101 can include an antenna array having a plurality of antenna elements that are each capable of delivering wireless power to client devices 102.1 to 102.4. Each transceiver system 101 can also transmit (Tx) and receive (Rx) wireless data communication signals to and from client devices 102.1 to 102.4, respectively. In some embodiments, the data communication antennas can communicate via Bluetooth™, Wi-Fi, ZigBee™, or other wireless communication protocols such IEEE 802.15.4 or IEEE 802.11. Also, in some embodiments, the wireless power and wireless communication signals can be delivered as a combined power/communication signal. In still other embodiments, not shown in FIG. 1, transceiver system 101 can include an additional antenna and/or an antenna array separate from the antenna array that implements data communication, but not wireless power delivery.

The transceiver system 101 can be configured to determine the appropriate phases to transmit coherent power signals 101.1-101.4 to client power receivers 103.1 to 103.4 as part of the WPTS. The antenna array can transmit a signal (e.g., a continuous wave or a pulsed power transmission signal) from each of the plurality of antenna elements at a specific phase relative to each other. Further, it is to be understood that use of the term "array" does not necessarily limit the antenna array to any specific array structure. That is, the antenna array need not be structured in a specific "array" form or geometry. Furthermore, as used herein, the term "array" or "array system" can be used to include related and peripheral circuitry for signal generation, reception, and transmission, such as in radios, digital logic, and modems.

Each client power receiver 103.1 to 103.4 can include one or more antennas (not shown) for receiving signals from the transceiver systems 101. The antenna array can be capable of emitting continuous wave signals at specific phases relative to each other. As discussed above, using an antenna array as a primary input device, transceiver system 101 can determine the appropriate phases for delivering coherent signals to the client power receivers 103.1 to 103.4. For example, coherent signals can be determined by computing the complex conjugate of a received beacon and/or other signal at each antenna element of the antenna array such that the coherent signal is properly phased for the particular client power receiver 103.1 to 103.4 that transmitted the beacon or other signal. The beacon signal and other signals described and illustrated, are primarily referred to herein as continuous waveforms, but alternatively or additionally take the form of modulated signal waveforms.

Although not illustrated in FIG. 1, each of the above listed components of the environment 100 (e.g., client power receivers 103.1 to 103.4, transceiver system 101, etc.) can include control and synchronization mechanisms, such as a data communication synchronization module. The transceiver systems 101 are connected to a power source such as, for example, a power outlet or source connecting the transmitters to a standard or primary alternating current (AC) power supply in a building. Alternatively, or additionally, one or more of the transceiver systems 101 can be powered by a battery or via another power-providing mechanism.

In some embodiments, the client power receivers 103 and/or the transceiver systems 101 utilize or encounter reflective surfaces such as, for example, walls or other RF reflective obstructions within range to beacon and deliver and/or receive wireless power and/or data within wireless communication and power delivery environment 100. One or more of the reflective surfaces can be utilized for multi-directional signal communication regardless of whether a blocking object is in the line of sight between transceiver system 101 and client power receiver 103.

As described herein, each client device 102.1 to 102.4 can be any system and/or device, and/or any combination of devices/systems that can establish a communication connection (e.g., session) with another device, a server and/or other systems within the example environment 100. In some embodiments, the client devices 102.1 to 102.4 include displays or other output functionalities to present data to a user and/or input functionalities to receive data from the user. By way of example, a client device 102 can be, but is not limited to, a video game controller, a server desktop, a desktop computer, a computer cluster, or a mobile computing device (such as a notebook, a laptop computer, a handheld or tablet computer, a mobile phone, a smart phone, a battery or component coupled to a battery, a PDA, etc.). The client device 102 can also be any wearable device such as watches, necklaces, rings, or even devices (e.g., medical or veterinary devices) implanted within a human or animal patient. Other examples of a client device 102 include, but are not limited to, safety sensors (e.g., fire or carbon monoxide), electric toothbrushes, electronic door locks/handles, electric light switch controllers, electric shavers, etc.

Although not illustrated in the example of FIG. 1, the transceiver system 101 and the client power receivers 103.1 to 103.4 can each include a data communication module for communication via a data channel. Alternatively, or additionally, the client power receivers 103.1 to 103.4 can direct the client devices 102.1 to 102.4 to communicate with the transceiver system 101 via existing data communications modules.

Figure 2:
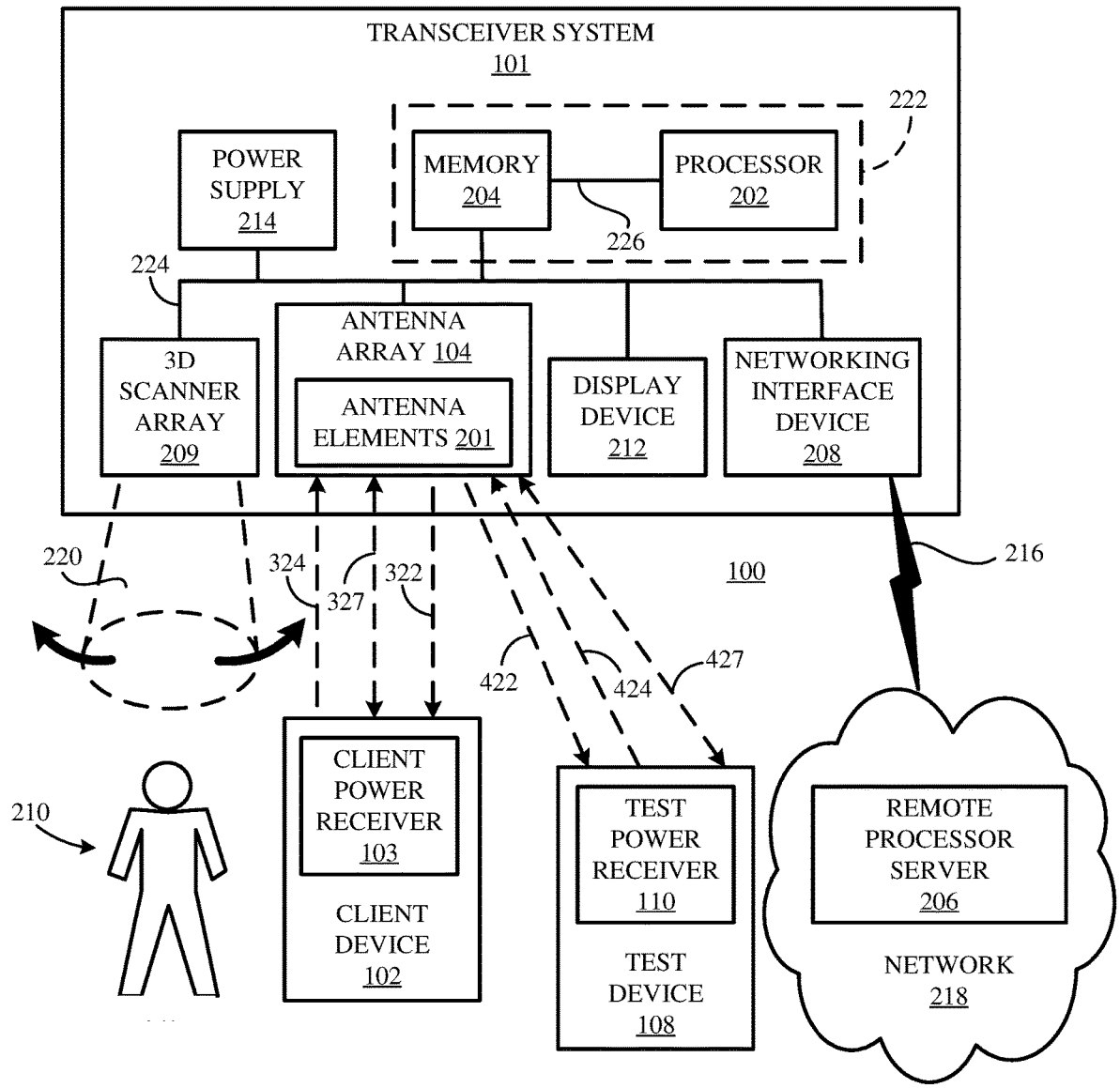
FIG. 2 is a block diagram illustrating an example transceiver system in accordance with various embodiments of the present technology.

FIG. 2 is a block diagram illustrating an example transceiver system 101 in accordance with an embodiment (e.g., transceiver system 101 shown in FIG. 1). The transceiver system 101 can include various functional components such as analog and digital electronic devices that are at least one of electrically and communicatively coupled together. In the embodiments shown in FIG. 2, antenna array 104 includes a plurality of antenna elements 201 arranged within antenna array 104 with a fixed geometry (not shown) relative to one another. In other embodiments, antenna array 104 includes one antenna element 201. In still other embodiments, antenna array 104 includes a plurality of antenna elements 201, but is capable of functioning in transceiver system 101 to perform the processes and methods described herein when only one element 201 is actually functioning for Tx, Rx, and/or power delivery.

As illustrated in FIG. 2, the functional components of transceiver system 101 can include a processor 202 and a memory 204 (including, e.g., a non-transitory processor-readable medium). Memory 204 can store various types and classes of data generated through, for example, the systems, methods, and processed described herein. Memory 204 can also store program instructions (e.g., software and/or firmware) that, when executed by processor 202, cause the processor 202 to manipulate (e.g., read, write, and delete operations, and combinations thereof) data stored in memory 204 and data stored in other transceiver system 101 components (e.g., data stored in registers and other data storage media thereof) associated with and/or communicatively coupled to processor 202 and/or memory 204. Through these data manipulations and other computation-related actions of processor 202 (e.g., carried out by an arithmetic logic unit and/or CPU of processor 202), the program instructions direct the implementation of the methods and processes herein described.

The various functionality described herein for processor 202 and/or memory 204 may, in some embodiments, be carried out by substantially similar components of a remote processor server 206 (e.g., networked cloud server). For example, remote processor server 206 located some distance from transceiver system 101 includes a remote processor server 206 processor and a memory, not shown. For considerations such as speed of data processing, amount and/or availability of data storage in memory, and reducing the size of the transceiver system 101, remote processor server 206 may entirely replace processor 202 and/or memory 204 in transceiver system 101, or may supplement a fraction of that functionality in transceiver system 101.

Transceiver system 101 may also include a network interface device 208 which is capable of receiving and transmitting data over a wired or wireless network communications protocol, including data retrieved from and/or stored in memory 204 that is received from and/or transmitted to, respectively, client 102 and/or test device 108, and/or a cloud-based application executed by one or more processors in a computing device of remote processor server 206). In the embodiments illustrated in FIG. 2, transceiver system 101 further includes a three-dimensional (3D) scanner array 209. 3D scanner array 209 acquires data representative of a physical layout of the environment including, for instance, distances between walls, distances between a ceiling and a floor, and relative positions of objects in the room.

Using data from the 3D scanner array 209, processor 202 can generate a detailed model of environment 100 as precise and accurate as a measurement and data acquisition precision and accuracy of 3D scanner array 209. The 3D scanner array includes, for example and without limitation, scanning infrared (IR) and/or laser range-finding 3D mapping systems to generate a detailed model of 3D spaces such as a room. A user of transceiver system 101 may interact with the 3D model stored in transceiver system 101 and/or elsewhere to assign identifiers to portions (e.g., immovable objects like a window sill and or movable objects such as furniture) of the 3D model and also assign a name (e.g., master bedroom) to the 3D model. In other embodiments, transceiver system 101 and/or other computing systems assign identifiers and/or names to the 3D model which are dynamically assigned as objects and/or other attributes of the respective 3D space change over time.

Transceiver system 101 can also include a display device 212. User-friendly values (e.g., a processor 202—rendered 3D model of environment 100) may be displayed on display device 212 that are visible to a user and/or they may be transmitted to a computing device such as a laptop or desktop computer (not shown in FIG. 2) of the user that is communicatively coupled to transceiver system 101. Furthermore, transceiver system 101 includes a power supply 214 which provides appropriate levels of electric power to network interface device 208, 3D scanner array 209, antenna array 104, processor 202, and, as needed, memory 204.

In response to inputs and/or events including receipt of beacon signal 324 and/or test beacon signal 424 at antenna array 104, processor 202 can execute the program instructions to implement the methods and processes described herein. Additional events such as receipt, via network interface device 208, of network traffic 216 including data and/or other signals from a network 218 further cause processor 202 to execute program instructions stored in memory 204 to implement processes and methods in transceiver system 101, either instead of, or in addition to, the methods and processes herein described.

Also, in the example embodiment illustrated in FIG. 2, receipt of a signal from a user 210 computing device (e.g., in addition to, or instead of, client device 102) communicatively coupled, via network interface device 208, to processor 202 causes 3D scanner array 209 to emit an IR radiation pattern 220 in a plurality of orbital directions (denoted by arrows in FIG. 2) to generate the detailed model of a 3D space such as environment 100 embodied in a room of a house. Data such as ranges to a plurality of points on reflective surfaces (not shown in FIG. 2) in the interior of the 3D space are stored as data in memory 204 and are used by processor 202 to generate (e.g., graphically render) the detailed model for viewing by user 210 on display device 212, and further for use in the methods and processes described herein. In some embodiments, processor 202 periodically emits IR radiation pattern 220 to generate the model without user 210 intervention.

In the embodiments illustrated in FIG. 2, a computer system 222 includes processor 202 and memory 204. Various common components (e.g., cache memory) are omitted for illustrative simplicity. The computer system 222 is intended to illustrate a hardware device on which the various process and methods described herein can be implemented. The components of computer system 222 and other components of transceiver system 101 can be coupled together via a power and data bus 224 bus or through some other known or convenient device.

The processor 202 shown in FIG. 2 may be, for example, a conventional microprocessor, microcontroller, a field-programmable gate array (FPGA), and combinations thereof. One of skill in the relevant art will recognize that the terms "processor-readable (storage) medium" or "computer-readable (storage) medium" include any type of device that is accessible by processor 202. Memory 204 is communicatively coupled to processor 202 by, for example, a memory bus 226. In addition to non-transitory media, the memory 204 can include, by way of example but not limitation, random access memory (RAM), such as dynamic RAM (DRAM) and static RAM (SRAM). The memory 204 can be local, remote, or distributed. Non-transitory (e.g., non-volatile) memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory 204 during execution of program instructions by processor 202. The non-volatile memory can be local, remote, or distributed.

Program instructions (e.g., software) are typically stored in non-volatile portions of memory 204 and/or a drive unit (not shown in FIG. 2). Indeed, for large programs, it may not even be possible to store the entire program in the memory 204. Nevertheless, it should be understood that for software to run, if necessary, it is moved to a processor 202—readable location appropriate for processing, and for illustrative purposes, that location is referred herein to as the memory 204. Even when software is moved to the memory 204 for execution, the processor 202 will typically make use of hardware registers to store values associated with the software, and further will cache those values locally to, ideally, speed up execution of program instructions and related operations with respect to memory 204. As used herein, a software program is assumed to be stored at any known or convenient location (from non-volatile storage to hardware registers) when the software program is referred to as "executed by and implemented in a processor 202—readable medium,", and similar terminology. A processor such as processor 202 is considered to be "configured to execute a program" when at least one value associated with the program is stored in a register readable by the processor.

The bus (e.g., data carrying portions of power and data bus 224) also couples the processor 202 and, optionally, the memory 204 to the network interface device 208. The network interface device 208 can include one or more of a modem, a router, and a network interface (e.g., a network interface card (NIC)). It will be appreciated that a modem or network interface can be considered to be part of the computer system 222. The network interface device 208 can include an analog modem, ISDN modem, cable modem, token ring interface, satellite transmission interface (e.g. "direct PC"), or other interfaces for coupling computer system 222 to other computer systems (e.g., remote processor server 206). The network interface device 208 can include one or more input and/or output (I/O) devices. The I/O devices can include, by way of example but not limitation, a keyboard, a mouse or other pointing device, disk drives, printers, a scanner, and other input and/or output devices, including display device 212. The display device 212 can include, by way of example but not limitation, a cathode ray tube (CRT), liquid crystal display (LCD), or some other applicable known or convenient display device. For simplicity, it is assumed that controllers of any devices not depicted in the example of FIG. 2 reside in the transceiver system 101.

In operation, the computer system 222 can be controlled by operating system software that includes a file management system, such as a disk operating system. One example of operating system software with associated file management system software is the family of operating systems known as Windows® from Microsoft Corporation of Redmond, Wash., and their associated file management systems. Another example of operating system software with its associated file management system software is the Linux operating system and its associated file management system. The file management system is typically stored in non-volatile portions of memory 204 and/or drive unit, and causes the processor 202 to execute the various acts required by the operating system to input and output data and to store data in the memory 204, including storing files on the non-volatile memory and/or drive unit.

A fail-safe module may be included within receiver 101. Some or all of the functionality of a fail-safe module may be implemented in hardware or software. The fail-safe module may be connected to the bus line 224 and used to report to the host processor 202 of transceiver 101 when an undesirable antenna array operation condition occurs and mitigation or resolution is required to communicate with a client receiver 103 located in 3D space. In some embodiments, the fail-safe module can receive pattern data from the antenna controller 104 and antenna elements 201 that it uses to determine if antenna array elements 201 are working as expected. If there is a reason to invoke an interrupt to the host processor due to need for remedy or loss of client communication, the fail-safe module provides the mitigation algorithm for system host processor to act on.

Figure 3:
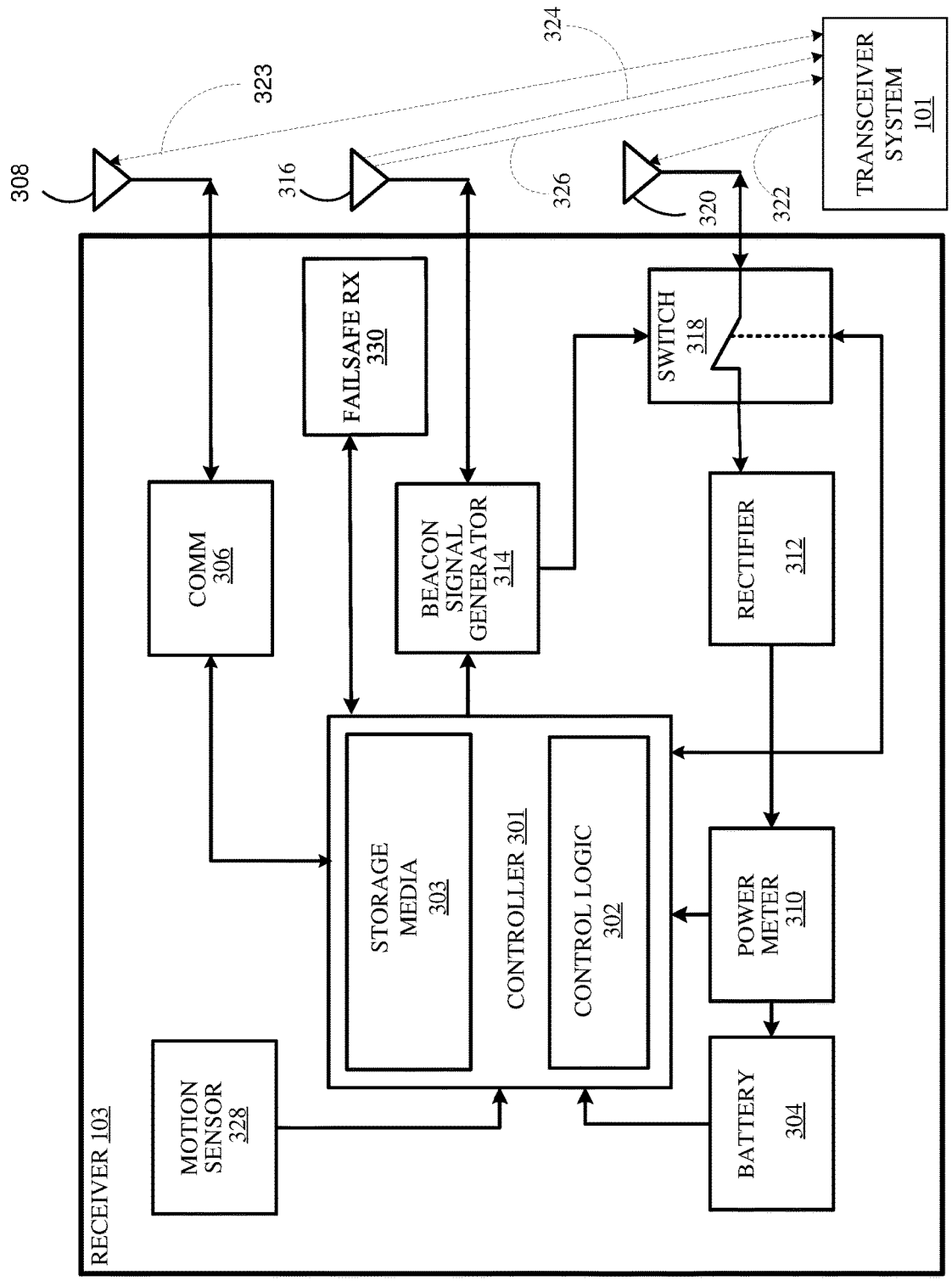
FIG. 3 is a block diagram illustrating an example client receiver in accordance with one or more embodiments of the present technology.

FIG. 3 is a block diagram illustrating an example client power receiver 103 in accordance with one or more embodiments. Client power receiver 103 may include various functional components such as analog and digital electronic devices or modules may be electrically and/or communicatively coupled together. The functional components of client power receiver 103 include a controller 301 having control logic 302 and data storage media 303. Client power receiver 103 also includes a battery 304, a communication block 306 and an associated first antenna 308, a power meter 310, a rectifier 312, a beacon signal generator 314 and an associated second antenna 316, and a switch 318 alternately coupling the rectifier 312 and the beacon signal generator 314 to an associated third antenna 320. Some or all of the above listed components of client power receiver 103 can be omitted in some embodiments. Additional or fewer components are also possible. For example, some embodiments of client devices 102 may also include accelerometers to measure acceleration of the device or a global positioning system that can identify the global positioning coordinates of the receiver and estimate current velocity.

The rectifier 312 receives (e.g., via the third antenna 320) a power transmission signal 322 from the transceiver system 101, which is fed through the power meter 310 to the battery 304 for charging. The power meter 310 measures the total received power signal strength and provides the control logic 302 with this measurement. The control logic 302 can also receive the battery power level from the battery 304 itself or receive battery power level data from, for example, an application programming interface (API) of an operating system running on the client device 102. The control logic 302 can also transmit/receive, via the communication block 306, a data signal on a data carrier frequency, such as the base signal clock for clock synchronization.

Using the second 316 and/or third 320 antennas, the beacon signal generator 314 transmits a beacon signal 324 or a calibration signal 326 to transceiver system 101. Furthermore, in the example embodiment, battery 304, and the first 308, second 316, and third 320 antennas are positioned in the client device 102. In other embodiments, at least one of the battery 304, and the first 308, second 316, and third 320 antennas are positioned in the client device 102. For example, and without limitation, some embodiments of client power receiver 103 can include a dedicated power supply such as a battery cell that may or may not be rechargeable through rectifier 312 and/or a plug-in charger circuit of the client power receiver 103. Thus, in such other embodiments, during such times when client device 102 is powered off, components of the system may remain fully capable of using the second 316 and/or third 320 antennas to transmit beacon signal 324 and/or calibration signal 326, as well as receive power transmission signal 322, for purposes of client device 102 localization and/or wireless power transmission system based battery 304 charging. At least one of the first 308, second 316, and third 320 antennas also enable client device to Tx/Rx a data signal 327 to/from transceiver system 101.

Although the battery 304 shown in FIG. 3 is charged via WPTS through the circuit including rectifier 312, the client power receiver 103 can also receive its supply power directly from the rectifier 312 instead of, or in addition to client power receiver 103 being powered by battery 304. Also, it can be noted that the use of multiple antennas (e.g., antennas 308, 316, and 320) is one example of implementation of client device 102 and as such, the structure can be reduced to one shared antenna, where the client device 102 multiplexes signal reception and transmission.

Client device 102 can also include a motion sensor 328 capable of detecting motion and signaling the control logic 302 of a motion event of client device 102. Client power receiver 103 can also integrate additional motion detection mechanisms such as accelerometers, assisted global positioning system (GPS), or other mechanisms. Once motion sensor 328 determines the motion event, control logic 302 assumes that the motion event equates to the client device 102. Control logic 302 then signals the transceiver system 101 modify the power transmission. In cases where the client power receiver 103 is used in a moving environment like a transceiver system 101—equipped vehicle, power may be transmitted intermittently or at a reduced level until the device is close to losing all available power. Motion sensor 328, as well as the aforementioned additional motion detection mechanisms may be integrated into client device 102.

As illustrated in FIG. 3, some embodiments of receiver 103 may include fail safe module 330. Fail-safe module 330 can monitor activity (e.g., signals, power consumption, instructions, etc.) and identify undesirable patterns. These patterns may include, for example, an antenna element staying in a static state when the antenna element should be changing. In some cases, the timing may be off. As a result, fail-safe module 330 can recognize an undesirable pattern or time interval and notify controller 301 to take corrective action to clear the undesirable condition.

Figure 4:
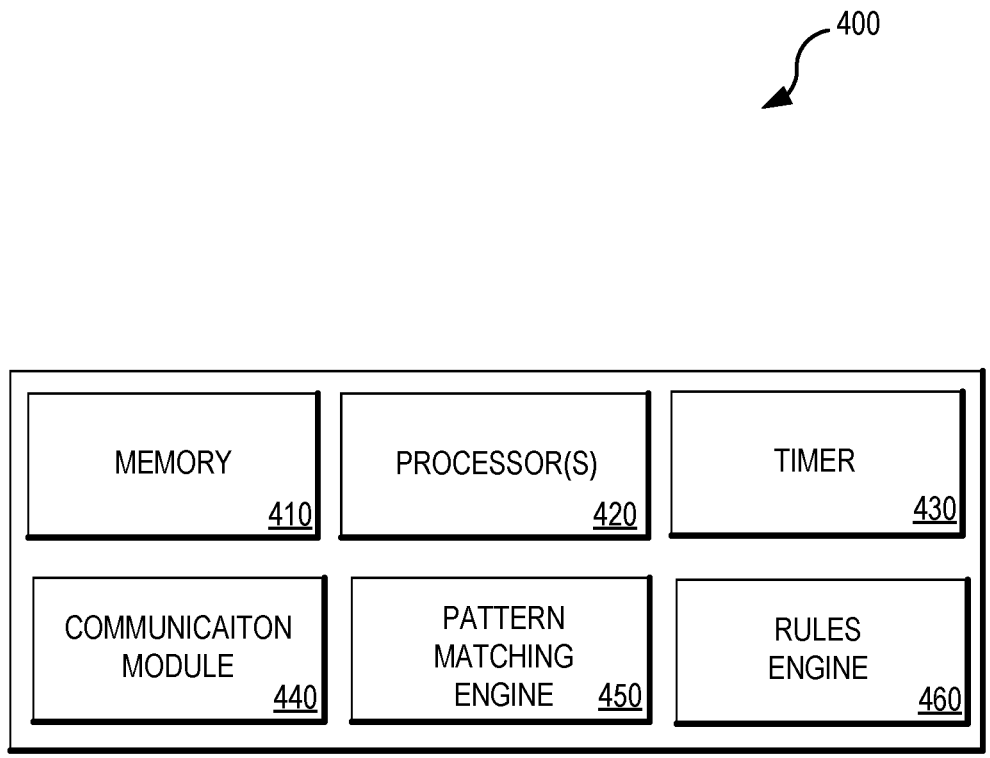
FIG. 4 illustrates a set of components within a fail-safe protection system that may be used in one or more embodiments of the present technology.

FIG. 4 illustrates a set of components within a fail-safe system 400 that may be used in one or more embodiments of the present technology. The fail-safe components shown in FIG. 4 may be integrated into a transmitter or client device. In addition, some or all of these components may be remotely located within one or more servers, computing systems, or devices. According to the embodiments shown in FIG. 4, fail safe system 400 may include memory 410, processor(s) 420, watchdog timers 430, communication modules 440, pattern matching engine 450, and/or rules engine 460. Each of these modules can be embodied as special-purpose hardware (e.g., one or more ASICS, PLDs, FPGAs, or the like), or as programmable circuitry (e.g., one or more microprocessors, microcontrollers, or the like) appropriately programmed with software and/or firmware, or as a combination of special purpose hardware and programmable circuitry. Other embodiments of the present technology may include some, all, or none of these modules and components along with other modules, applications, and/or components. Still yet, some embodiments may incorporate two or more of these modules and components into a single module and/or associate a portion of the functionality of one or more of these modules with a different module.

Memory 410 can be any device, mechanism, or populated data structure used for storing information as described above. Memory 410 may be used to store instructions for running one or more fail safe protection applications or fail-safe scenario programs executed by processor(s) 420. For example, memory 410 could be used in one or more embodiments to house all or some of the instructions needed by processor(s) 420 to execute the functionality of watchdog timer 430, communication module 440, pattern matching engine 450, and/or rules engine 460.

Watchdog timer 430 keeps track of how long the wireless power transmission system is staying in a certain state. For example, an antenna array may have the following communication cycles:

Rx State 1|Tx State 1|Rx State 2|Tx State 2|Tx State 3
Phase $T_1$|Phase $T_2$|Phase $T_3$ Watchdog timer 430 can monitor the amount of time the antenna array (or array elements) stays in each of these states. Pattern matching engine 450 can use this information to compare the actual state cycle pattern the antenna array generates with the expected state cycle pattern. In some embodiments, pattern matching engine 450 may use rules engine 460 to help identify potential problems. Then, communication modules 440 can report the problem to a fail-safe protection module. In some embodiments, state switching sequential counters may be used. If the state counter does not complete the start and end states within a specific time frame, then watch dog timer 430 would pass a fail indication to the communication module 440, then interrupt processor 420 to take corrective action governed by the rules engine 460.

Figure 5:
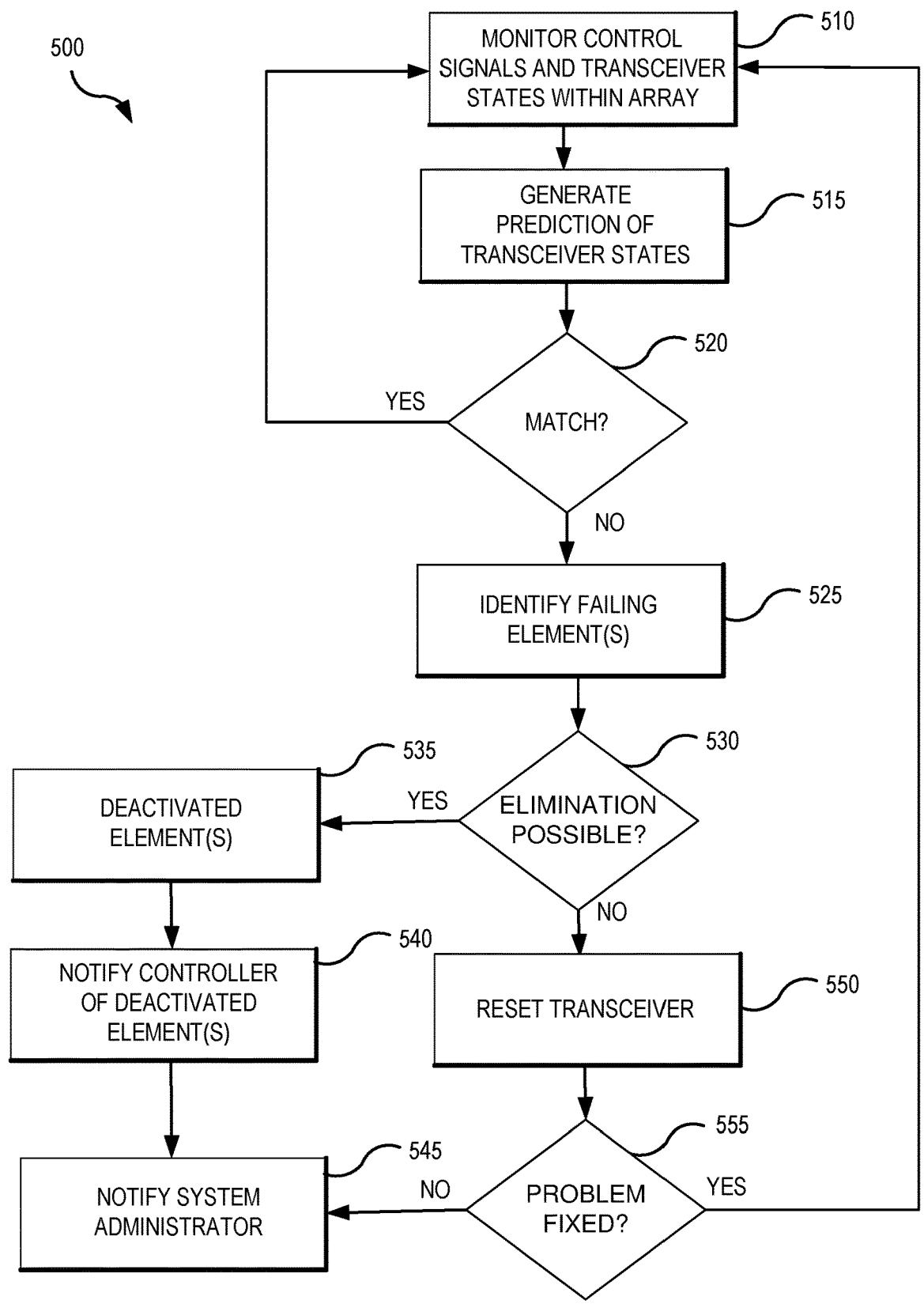
FIG. 5 is a flowchart illustrating a set of operations for operating a wireless communication/power delivery system with fail safe operations in accordance with some embodiments of the present technology.

FIG. 5 is a flowchart illustrating a set of operations 500 for operating a wireless communication/power delivery system with fail safe operations in accordance with some embodiments of the present technology. As illustrated in FIG. 5, monitoring operation 510 monitors the control signals and transceiver states within an array. Using the control signals, generation operation 515 can generate a predication of expected transceiver states. Comparison operation 520 can determine whether the expected transceiver states match the actual transceiver states. When comparison operation 520 determines that the expected and actual transceiver states match, comparison operation 520 branches to monitoring operation 510 where the control signals and transceiver states are monitored.

When comparison operation 520 determines that the expected and actual transceiver states do not match, comparison operation 520 branches to identification operation 525 where failing elements are identified. For example, identification operation 525 may identify that one or more antennas cannot be properly controlled. Using this information, elimination operation 530 determines if the system can deactivate a portion of the system (e.g., a portion of the antenna array) and still have some useful functionality.

For example, some embodiments can set the TX control line of transceivers through antenna controller and read these lines through an independent monitoring circuitry that can be constantly watching the activities for all critical control signals. This monitoring circuitry can be tightly coordinated to antenna controller and aware of the states and transitions in all moments. If the TX line does not get asserted or de-asserted, an error/interrupt can be notified to the main central unit to take a safe action given situation. In this case, system can enter to a limited protected state that deactivates only those transceivers that are not in expected state(s) and continue running or enter to a very conservative safe-state of IDLE and wait for another higher level/higher authority commands to intervene. As another example, in some embodiments, isolated antenna array section or slices can be selected out (e.g., by deactivation) by interaction logic under the control of the antenna AMB controller.

When elimination operation 530 determines the problem can be isolated, elimination operation 530 branches to deactivation operation 535 where one or more elements are deactivated. Notification operation 540 notifies the system controller of the deactivated elements and alert operation 545 can generate a notification to a system administrator. As a result, the controller can modify subsequent control signals based on available resources. In accordance with various embodiments, the control signal behaviors given these unexpected patterns can be designed around safety (e.g., system enters into complete IDLE more) or getting partially conservative (de-activate those nodes that do not follow the normal-patterns). For example, subsequent control signals may be generated that isolate an antenna array section or slices so that only properly working sections are utilized.

When elimination operation 530, determines the problem cannot be isolated, elimination operation 530 branches to reset operation 550 where the system is reset and a recovery protocol can be initiated. Various embodiments may use different recovery protocols that demand either manual hard-interventions (e.g., AC cycle power, reset, etc.) or soft-interventions (e.g., re-try, self-reboot, re-initializations, etc.). Determination operation 555 can determine whether the reset and/or recovery protocol fixed the problem. For example, determination operation 555 may repeat control signals that were used to create the problem. When determination operation 555 determines the problem is fixed, determination operation 555 branches to monitoring operation 510 to monitor for future problems. When determination 555 determines the problem is not fixed, determination operation 555 branches to alert operation 545 and shuts down the system.

Figure 6:
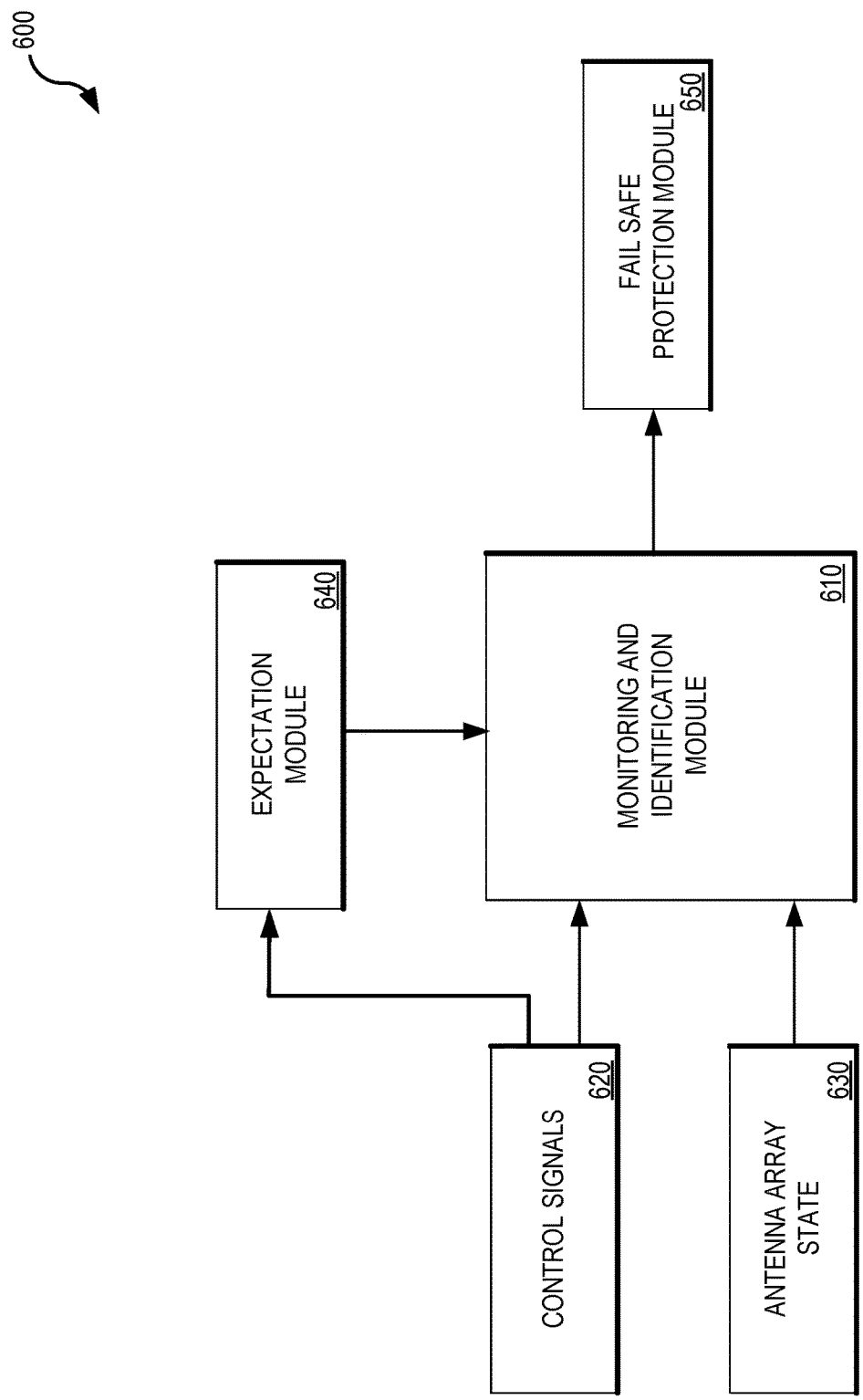
FIG. 6 illustrates a set of components within a fail-safe system according to one or more embodiments of the present technology.

FIG. 6 illustrates a set of components within a fail-safe system 600 according to one or more embodiments of the present technology. Monitoring and identification module 610 can receive the control signals status input from the control circuitry or signals module 620, detected antenna array state module 630, and a set of expected circuit activity states generated by expectation module 640. Using this input information, monitoring and identification module 610 can send a signal to fail-safe protection module 650 when a potential problem is detected.

For example, some digital pins controlling the Tx lines of the transceivers may be stuck at an active state. This will create an unexpected configuration that may impose a safety risk. As a result, some embodiments may flag the configuration as an invalid state since the power transmission system is deemed to cycle through different transmission/reception phases and stalling at Tx state is deemed to be invalid. One safety-aware implementation for this example is to implement a watch-dog timer (e.g., 430 in FIG. 4) to monitor the Tx line and if the timer is expired and that line does not toggle to a no-transmission state, antenna controller (e.g., FPGA/ASIC) needs to automatically shut off the chargers/AUCs.

In some embodiments, the antenna array state module 630 may include monitored phases in all antennas. Given a changing environment/propagation channel, monitoring and identification module 610 will expect to read different phases in different movements. As the phases are updated and changes in the propagation channel are tracked, potential problems can be identified. The monitoring and identification module 610 may assume that there may be an invalid condition or circuit compromised occurred with potential harm (e.g., un-intentionally focusing to an unwanted point/location) to the system.

Fail-safe protection module 650 can enter a mitigation or recovery state in response to the signal from the monitoring logic. For example, if there is a failure detected by monitoring circuitry, the host system may get an error/interrupt notification and the main host software can take a safe action given the situation. In this case, some embodiments of the system can enter to a limited protected state that deactivates only those transceivers that are not in expected state(s) and continue running. In some embodiments, the system can enter to a very conservative safe-state of IDLE and wait for another higher level/higher authority commands to intervene and recover the system (e.g., hard-reset, re-try, etc.).

Figure 7:
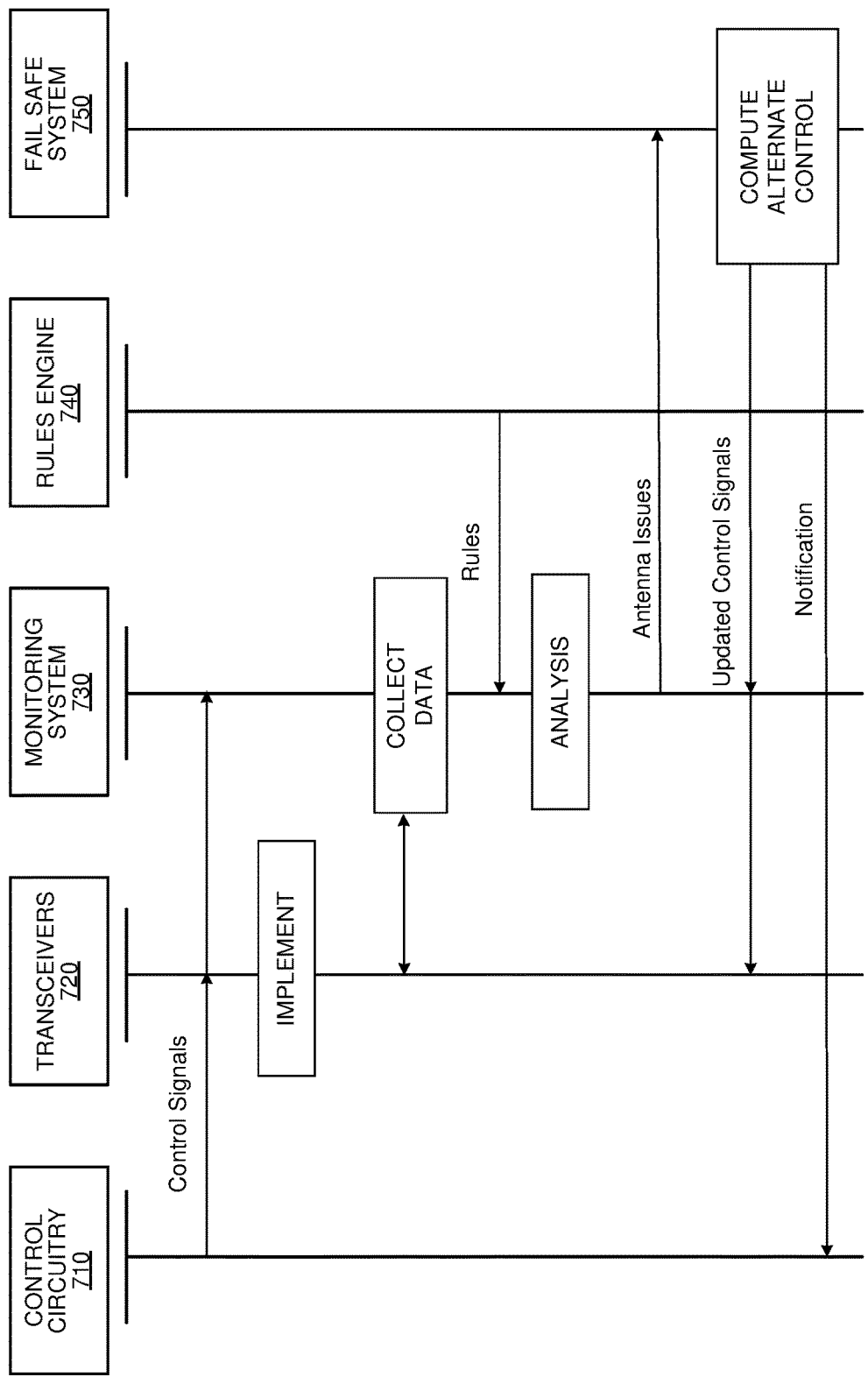
FIG. 7 is a sequence diagram illustrating an example of the data flow between various components of a wireless power transmission system with fail safe components according to various embodiments of the present technology.

FIG. 7 is a sequence diagram illustrating an example of the data flow between various components of a wireless power transmission system with fail safe components according to various embodiments of the present technology. As illustrated in FIG. 7, control circuitry 710 sends a set of control signals to transceivers 720 and monitoring system 730. These control signals are related to the key control lines that configure the transceivers into different mode (receive mode, transmit mode, phase capture, changing the phase, idle-mode) and are transceiver-design specific. For example, a TX line to the transceiver can set the transceiver to put-out RF energy, or an RX line can be used to set the transceiver to RX mode to capture the incoming phase. In some implementations, there may be a command indicating when to sample the phase. Transceivers 720 implement the instructions. Monitoring system 730 records the response of transceivers 720.

Using rules from rules engine 740, monitoring system 730 can analyze the response and identify any potential antenna issues. These identified issues are reported to fail safe system 750 where alternate response controls are generated and sent to transceivers 720 and monitoring system 730. In addition, fail safe system 750 can notify control circuitry 710 to deactivate a portion of transceivers 720 as appropriate and resample the system antenna array performance for improvement or degradation.

Exemplary Computer System Overview

Figure 8:
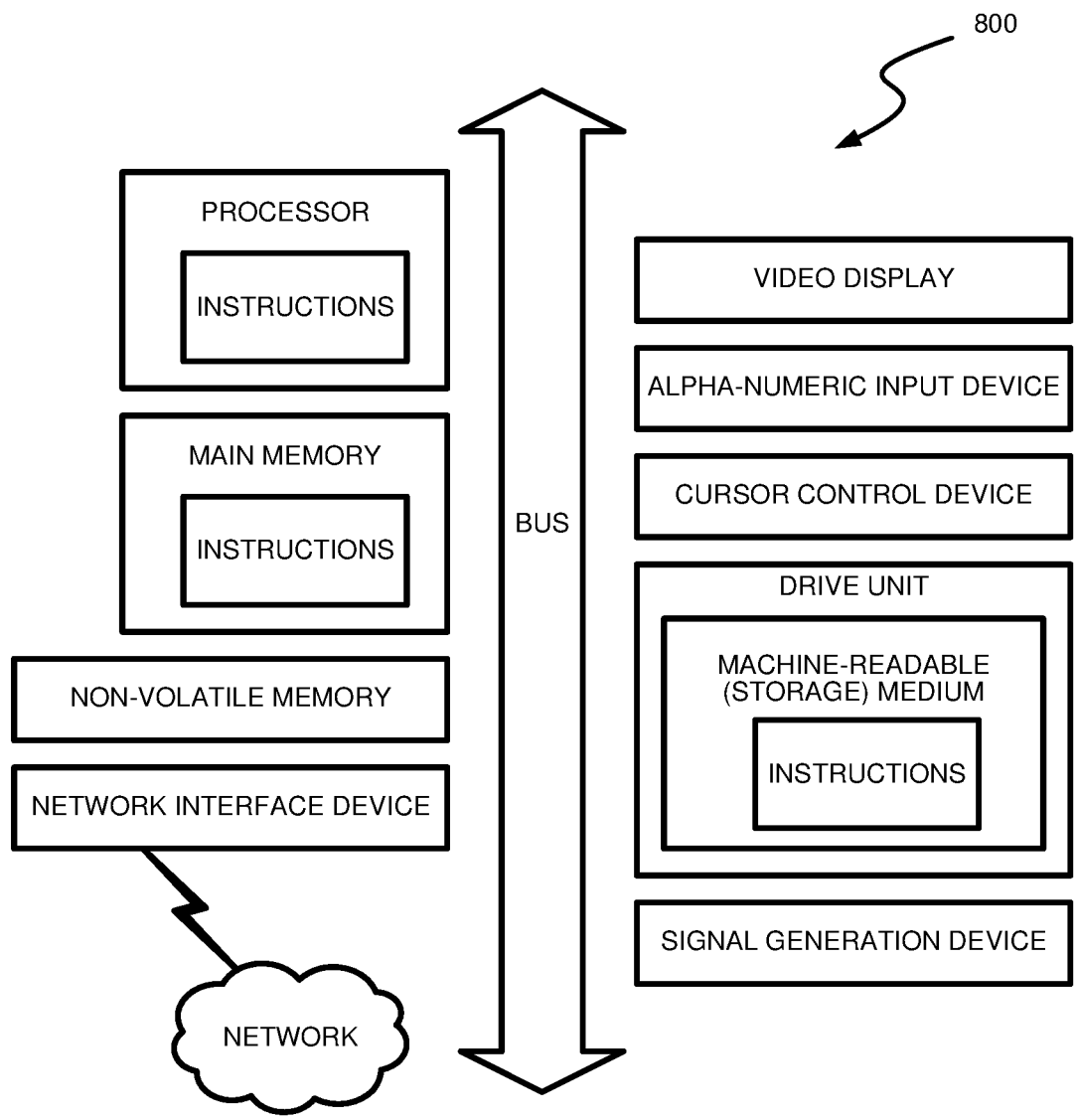
FIG. 8 depicts a diagrammatic representation of a machine, in an example form, of a computer system within which a set of instructions, for causing the machine to perform any one or more of the methodologies discussed herein, may be executed.

FIG. 8 depicts a diagrammatic representation of a machine, in the example form, of a computer system within which a set of instructions, for causing the machine to perform any one or more of the methodologies discussed herein, may be executed.

In the example of FIG. 8, the computer system includes a processor, memory, non-volatile memory, and an interface device. Various common components (e.g., cache memory) are omitted for illustrative simplicity. The computer system 800 is intended to illustrate a hardware device on which any of the components depicted in the example of FIG. 1 (and any other components described in this specification) can be implemented. For example, the computer system can be any radiating object or antenna array system. The computer system can be of any applicable known or convenient type. The components of the computer system can be coupled together via a bus or through some other known or convenient device.

The processor may be, for example, a conventional microprocessor such as an Intel Pentium microprocessor or Motorola power PC microprocessor. One of skill in the relevant art will recognize that the terms "machine-readable (storage) medium" or "computer-readable (storage) medium" include any type of device that is accessible by the processor.

The memory is coupled to the processor by, for example, a bus. The memory can include, by way of example but not limitation, random access memory (RAM), such as dynamic RAM (DRAM) and static RAM (SRAM). The memory can be local, remote, or distributed.

The bus also couples the processor to the non-volatile memory and drive unit. The non-volatile memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software in the computer 800. The non-volatile storage can be local, remote, or distributed. The non-volatile memory is optional because systems can be created with all applicable data available in memory. A typical computer system will usually include at least a processor, memory, and a device (e.g., a bus) coupling the memory to the processor.

Software is typically stored in the non-volatile memory and/or the drive unit. Indeed, for large programs, it may not even be possible to store the entire program in the memory. Nevertheless, it should be understood that for software to run, if necessary, it is moved to a computer readable location appropriate for processing, and for illustrative purposes, that location is referred to as the memory in this document. Even when software is moved to the memory for execution, the processor will typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium". A processor is considered to be "configured to execute a program" when at least one value associated with the program is stored in a register readable by the processor.

The bus also couples the processor to the network interface device. The interface can include one or more of a modem or network interface. It will be appreciated that a modem or network interface can be considered to be part of the computer system. The interface can include an analog modem, ISDN modem, cable modem, token ring interface, satellite transmission interface (e.g. "direct PC"), or other interfaces for coupling a computer system to other computer systems. The interface can include one or more input and/or output devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted in the example of FIG. 8 reside in the interface.

In operation, the computer system 800 can be controlled by operating system software that includes a file management system, such as a disk operating system. One example of operating system software with associated file management system software is the family of operating systems known as Windows® from Microsoft Corporation of Redmond, Wash., and their associated file management systems. Another example of operating system software with its associated file management system software is the Linux operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

Some portions of the detailed description may be presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally conceived to be a self-consistent sequence of operations leading to a desired result. These operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general-purpose systems may be used with programs in accordance with the teachings herein, or it may prove convenient to construct more specialized apparatus to perform the methods of some embodiments. The required structure for a variety of these systems will appear from the description below. In addition, the techniques are not described with reference to any particular programming language, and various embodiments may thus be implemented using a variety of programming languages.

In alternative embodiments, the machine operates as a standalone device or may be connected (e.g., networked) to other machines. In a networked deployment, the machine may operate in the capacity of a server or a client machine in a client-server network environment or as a peer machine in a peer-to-peer (or distributed) network environment.

The machine may be a server computer, a client computer, a personal computer (PC), a tablet PC, a laptop computer, a set-top box (STB), a personal digital assistant (PDA), a cellular telephone, an iPhone, a Blackberry, a processor, a telephone, a web appliance, a network router, switch or bridge, or any machine capable of executing a set of instructions (sequential or otherwise) that specify actions to be taken by that machine.

While the machine-readable medium or machine-readable storage medium is shown in an exemplary embodiment to be a single medium, the term "machine-readable medium" and "machine-readable storage medium" should be taken to include a single medium or multiple media (e.g., a centralized or distributed database, and/or associated caches and servers) that store the one or more sets of instructions. The term "machine-readable medium" and "machine-readable storage medium" shall also be taken to include any medium that is capable of storing, encoding or carrying a set of instructions for execution by the machine and that cause the machine to perform any one or more of the methodologies of the presently disclosed technique and innovation.

In general, the routines executed to implement the embodiments of the disclosure, may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processing units or processors in a computer, cause the computer to perform operations to execute elements involving the various aspects of the disclosure.

Moreover, while embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution.

Further examples of machine-readable storage media, machine-readable media, or computer-readable (storage) media include but are not limited to recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), among others, and transmission type media such as digital and analog communication links.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for", but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A method comprising:
   monitoring multiple states of a wireless power transmission system having an array of antennas;
   determining whether each of the multiple states of the wireless power transmission system are in an expected configuration,
      wherein the expected configuration comprises a sequence of transmitting and receiving states; and
   identifying a problem within the wireless power transmission system by analyzing the multiple states and the expected configuration.

2. The method of claim 1, wherein monitoring the multiple states of the wireless power transmission system includes identifying whether antennas in the array of antennas are in a transmitting or receiving state.

3. The method of claim 1, wherein the problem within the wireless power transmission system includes one or more antennas within the array of antennas being in an invalid state.

4. The method of claim 3, wherein the invalid state includes being stuck in a transmission or receiving mode, the method further comprising:
   deactivating the one or more antennas within the array of antennas that are in the invalid state; and
   notifying a control system associated with the one or more antennas that have been deactivated.

5. The method of claim 4, wherein the control system generates an alternative control signal based on the array of antennas with the one or more antennas that have been deactivated.

6. The method of claim 1, wherein monitoring the multiple states of the wireless power transmission system includes monitoring the states over a predetermined period of time.

7. The method of claim 1, wherein identifying the problem within the wireless power transmission system by analyzing the multiple states and expected configuration includes performing a pattern matching analysis.

8. A wireless power transmission system comprising:
   an adaptively-phased antenna array having multiple radio frequency (RF) antennas; and
   control circuitry operatively coupled to the multiple RF antennas, the control circuitry configured to:
      generate a set of control signals to place the multiple RF antennas in a predetermined set of states,
         wherein the predetermined set of states comprises a sequence of transmitting and receiving states;
      monitor an actual set of states of the multiple RF antennas; and
      identify a potential problem with one or more of the multiple RF antennas based on the actual set of states and the predetermined set of states.

9. The wireless power transmission system of claim 8, wherein the control circuitry is further configured to:
   accumulate a record of the actual set of states, the set of control signals, and the predetermined set of states over multiple cycles in a memory.

10. The wireless power transmission system of claim 9, further comprising:
    a pattern matching engine configured to perform a pattern matching analysis to identify the potential problem based on the record of the actual set of states, the set of control signals, and the desired set of states over multiple cycles.

11. The wireless power transmission system of claim 8, further comprising:
    a memory having stored thereon a set of rules that, when executed by the control circuitry identify potential problem by comparing the desired set of states with the actual set of states of the multiple RF antennas.

12. The wireless power transmission system of claim 8, further comprising:
    a fail-safe protection module communicably coupled to the control circuitry, wherein the fail-safe protection module is configured to deactivate one or more antennas of the multiple RF antennas that are illustrating an invalid behavior.

13. The wireless power transmission system of claim 12, wherein the invalid behavior includes being stuck in a transmission or receiving state and the control circuitry is further configured to:
    update subsequent control signals by taking into account the one or more antennas that have been deactivated.

14. The wireless power transmission system of claim 9, wherein the control circuitry is further configured to:
    determine, based on a processing rule triggered by the potential problem, a recovery protocol that includes one or more hard or soft interventions.

15. A non-transitory computer-readable storage medium containing instructions that, when executed by one or more processors, cause one or more processors to:
    monitor multiple states of a wireless power transmission system,
       wherein the wireless power transmission system includes an array of antennas;
    determine whether each of the multiple states are in an expected configuration,
       wherein the expected configuration comprises a sequence of transmitting and receiving states; and
    identify a problem within the wireless power transmission system by analyzing the multiple states and expected configuration.

16. The computer-readable storage medium of claim 15, wherein to monitor the multiple states of the wireless power transmission system, the instructions, when executed by the one or more processors, further cause the one or more processors to:
    identify whether antennas in the array of antennas are in a transmitting or a receiving state.

17. The computer-readable storage medium of claim 15, wherein the problem within the wireless power transmission system includes one or more of antennas within the array of antennas being stuck in a transmission or a receiving mode.

18. The computer-readable storage medium of claim 17, wherein the instructions, when executed by the one or more processors, further cause the one or more processors to:
    deactivate the one or more antennas within the array of antennas that are stuck in the transmission or the receiving mode; and
    notify a control system associated with the one or more antennas that have been deactivated.

19. The computer-readable storage medium of claim 17, wherein the instructions, when executed by the one or more processors, further cause the one or more processors to:
    generate an alternative control signal based on the array of antennas with the one or more antennas that have been deactivated.

20. The computer-readable storage medium of claim 15, wherein the instructions, when executed by the one or more processors, further cause the one or more processors to:
    perform a pattern matching analysis to identify the problem within the wireless power transmission system.

* * * * *